United States Patent
Dai

(10) Patent No.: US 8,159,799 B2
(45) Date of Patent: Apr. 17, 2012

(54) PROTECTIVE DEVICE AGAINST ABNORMALITY FOR POSITIVE AND NEGATIVE DUAL POWER SUPPLY CIRCUIT

(75) Inventor: Jun Dai, Shenzhen (CN)

(73) Assignee: Shenzhen Skyworth-RGB Electronic Co., Ltd., Shenzhen (CN)

( * ) Notice: Subject to any disclaimer, the term of this patent is extended or adjusted under 35 U.S.C. 154(b) by 0 days.

(21) Appl. No.: 12/694,045

(22) Filed: Jan. 26, 2010

(65) Prior Publication Data

US 2010/0219686 A1 Sep. 2, 2010

Related U.S. Application Data

(63) Continuation of application No. PCT/CN2008/000548, filed on Mar. 20, 2008.

(30) Foreign Application Priority Data

Jan. 15, 2008 (CN) .......................... 2008 1 0065061

(51) Int. Cl.
   *H02H 3/08* (2006.01)

(52) U.S. Cl. ..................................... 361/93.1

(58) Field of Classification Search ................... 361/93.1
   See application file for complete search history.

(56) References Cited

U.S. PATENT DOCUMENTS

| | | | | |
|---|---|---|---|---|
| 3,564,528 A | * | 2/1971 | Drushel | 340/521 |
| 4,063,185 A | * | 12/1977 | Kojima et al. | 330/255 |
| 4,313,145 A | | 1/1982 | Ienaka et al. | |
| 6,541,826 B2 | * | 4/2003 | Iwagami et al. | 257/379 |
| 6,650,165 B1 | * | 11/2003 | Mallikarjunaswamy | 327/310 |
| 2004/0021502 A1 | * | 2/2004 | Voldman | 327/534 |
| 2004/0233595 A1 | * | 11/2004 | Ker et al. | 361/56 |

FOREIGN PATENT DOCUMENTS

| | | |
|---|---|---|
| CN | 1540978 A | 10/2004 |
| CN | 2662567 Y | 12/2004 |
| JP | 1-179523 A | 7/1989 |

OTHER PUBLICATIONS

International Search Report of PCT/CN2008/000548, dated Oct. 30, 2008.

* cited by examiner

*Primary Examiner* — Jared Fureman
*Assistant Examiner* — Nicholas Ieva
(74) *Attorney, Agent, or Firm* — Hamre, Schumann, Mueller & Larson, P.C.

(57) ABSTRACT

This invention mainly involves in the consumer electronic product fields, especially in the protective devices against abnormality for positive and negative power circuits of TV and audio technology field. In one embodiment, in the last stage output port load (RL) circuit of the dual power supply, a series current negative feedback resistor R371 is added or used as the detection source, by the integration of Resistor R46V and Capacitor C46V, and then through the pressure-sensitive switching unit VD46 or Diode D46 branch circuit, is connected with normally closed and overload conducting overload shutdown devices so as to perform timely and effective protection against OCL circuit over current or other abnormalities in the positive and negative power supply.

7 Claims, 8 Drawing Sheets

PROTECTIVE DEVICE AGAINST ABNORMALITY FOR POSITIVE AND NEGATIVE DUAL POWER SUPPLY CIRCUIT

BACKGROUND OF THE INVENTION

1. Field of the Invention

The present invention generally relates to consumer electronics and, more particularly, relates to TV and audio technology.

2. Description of Related Art

With regard to existing circuits requiring positive and negative symmetrical dual power supply, what are the most commonly seen are OCL audio power amplifying and color TV field scanning circuits. These OCL power amplifying circuits without output coupling capacitors have greater failure rate and hazard than those OCL power amplifying circuits with output coupling capacitors. This is because when the OTL power amplifying circuits are damaged, the blocking coupling capacitors can protect other loads from being easily burned. When the OCL circuits are damaged, not only can the last stage loads be easily burned, but also other failures will be extended jointly. Such other failures include the burns of sound boxes, video tube necks and transformers. Therefore, a protection circuit is needed to protect the OCL circuits against abnormality.

Some existing OCL circuits, especially the color TV field output circuits, have been equipped with additional protection measures against the abnormality. However, the circuit can be very complicated. In addition, the existing technology is effective to only one of the load short-circuits when the loads of positive and negative dual power are subject to imbalance. Namely, it is only effective to the load short-circuit of positive power or the load short-circuit of negative power and ineffective to the simultaneous short-circuit of loads of both the positive and negative power or other abnormalities of balance symmetry. For OCL circuit abnormalities, in the majority of cases, the original power integrated device is in good condition, but its external elements cause abnormal overload, which then causes damage to the power integrated device, and further leads to other failures, such as, for example, the burns of the sound boxes and video tubes. However, the existing technology fails to provide a solution to protect the power integrated module in time and prevent it and the last stage loads from being burned before the power integrated module is damaged in the event that the abnormal state occurs.

Therefore, it is desired to provide a timely and effective protection over the circuit before the power integrated device IC is damaged in the event that the external elements of the power integrated device IC causes an abnormal state.

SUMMARY OF THE INVENTION

Accordingly, the present invention is directed to a protective device against abnormality for positive and negative dual power supply circuits. The protective device is equipped with an overload protective device or other protective devices against abnormality. Its characteristics include: in the circuit of the last stage output load (RL) of dual power OCL power circuit, series current negative feedback resistance R371 is added or applied as a detection source, which, after integration of resistance R46V and capacitor C46V, and then through the branch circuits of pressure-sensitive switch VD46 or diode D46, is connected to the over-load shutdown device which is normally closed and over-load conduct, so as to protect the positive and negative dual power supply OCL circuit from over current or other abnormalities.

The outstanding advantages of this invention include: simple and reliable circuit, punctual and accurate protection and effectively preventing other jointly extended failures. In particular, for those OCL audio power amplifying and field scanning output stages adopting the positive and negative dual power supply, if damage were initially caused by external components, they can be protected from over-current or other abnormalities in a timely manner. Not only can they effectively prevent damage to the integrated modules, but also they can protect damage to the last stage loads (such as speakers, deflection coils, video tubes necks).

BRIEF DESCRIPTION OF THE DRAWINGS

The drawings include 11 Figures on three pages. [The Figures come from the schematic diagrams corresponding to specific printed circuit boards (PCB) of true color TV products, and they are illustrated in partially enlarged views.]. Different fonts are used for these Figures, names of functions of all components after combination, component position numbers, component parameters or substitution ranges to facilitate discrimination. In particular, numerical symbols or block diagrams of mapped miniatures of enlarged fonts with blocks and dotted lines having considerable functions after combined connection by multiple components can better facilitate interpretation by referring to the summary. The figures are intended to strive to make detailed illustration of the embodiments of essential and substantial characteristics of this Invention. Among them, $\phi$ indicates that it is modifiable or removable, "*" indicates that parameters can be debugged and changed as the case may be, while ":" indicates that such components can be removed. When pulse transformers are primarily conducted, the like terminals of primary and secondary induction polarity must be represented by a black dot without exception. General triode can be iterated and replaced with FET. Unless otherwise annotated in the specification and the Figures (especially for components and their position numbers), they shall be interpreted pursuant to the relevant statutory or established practices. Circuit components, parameters and their position numbers only indicate the position numbers of figures and related properties BOM parameters of components in the actual printed circuit boards PCB relevant to the schematic diagram of the entire products only provide reference for the specific products of the preferred embodiments of this Invention other than marking for the summary. Among them.

FIGS. 8A-C show an embodiment of a color TV fly-back transformer FBT secondary power distribution and overload shutdown devices;

"⊥" (or by adding other marks) is used to indicate "ground" of the common port of irrelevant cold base (circuit) board of a power grid, and the common port of the winding of the switching power supply transformer T or the common port of the winding of the fly-back transformer FBT is marked by "⊥GND" and "⊥GND2" respectively. In different figures, those containing the same mark or with the same object are understood to be of the same functionality or performance or effect. Vcc may refer to any high potential port of a power, and sometimes for the purpose of discriminating different kinds of Vcc, different power source marks like 5V–1, 12V–1, ±13V, and 26V are used, and can be any necessary values of different power supply. In the same figure, apart from Vcc, those with the same marks of figures can be connected. Roles of different figures are set out in the description in the text below. In different figures those containing the same mark or with the same object mean the same functionality or performance or effect. Vcc may refer to any high potential port of a power source, and may be different power voltage values. In the same figure, apart from Vcc, those with the same marks of the position numbers of figures can be connected, with roles of each figure set out in the description in the text below.

DESCRIPTION OF THE EMBODIMENTS

Hereinafter, exemplary embodiments of the present invention will be described with reference to the accompanying drawings. There will be no repeated explanation of what has been described above or the application of the existing technologies or necessary changes in the same manner, or other matters concerned.

Throughout this specification, the term "positive-way rectifier" means that pulse transformer secondary circuit through the series with diode rectifier is the same polarity rectifier of filtering circuit comparing with the original coil on/off. "Reverse-way rectifier" refers that the pulse transformer secondary circuit through the series with diode rectifier is the opposite the anti-polarity rectifier filtering circuit comparing with the original coil on/off.

Figure 1:
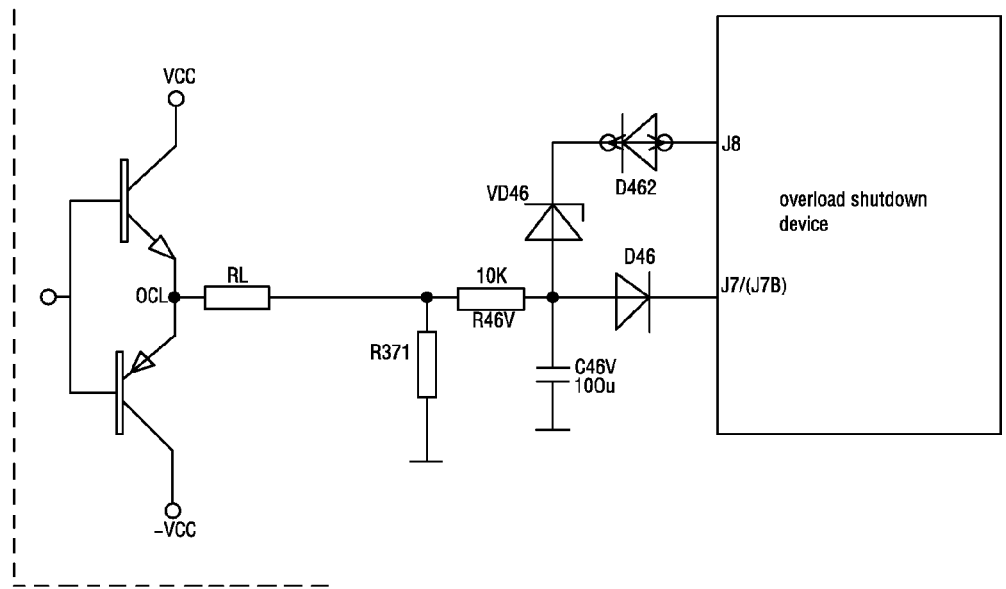
FIG. 1 is the essential point for the technical solution to the present invention.

FIG. 1 illustrates one embodiment of the protective devices against abnormality for positive and negative power supply circuits to which overload or protective devices against abnormality are added. In the last stage output port load (RL) circuits of this dual power supply OCL power circuits, a series current negative feedback resistor R371 is added to or applied as a detection source. The resistor R371 is connected to an integration circuit formed by a resistor R46V and a capacitor C46V, and is then connected to the over-load shutdown device which is normally closed and over-load conduct through pressure-sensitive switching part VD46 branch circuits or diode D46 branch circuits, so as to protect the positive and negative dual power supply OCL circuit from over current or other abnormalities. In a normal state or when the load balance is symmetrical, both ends of Capacitor C46V are at the same level of voltage but in opposite directions, and the voltage after integration is zero; if respective loads of the positive and negative power supply are asymmetrical and imbalanced causing any abnormal state, after the integration, the voltage of Capacitor C46V turns into a positive voltage or a negative voltage. The Capacitor C46V is connected, through the pressure-sensitive switching units of normally closed and overload conducting (e.g. diodes D46 or voltage regulator VD46) branch circuits, with the normally closed and overload conducting overload shutdown device, thus providing protection to the positive and negative dual power supply against OCL circuit over current or other abnormalities.

Figure 2:
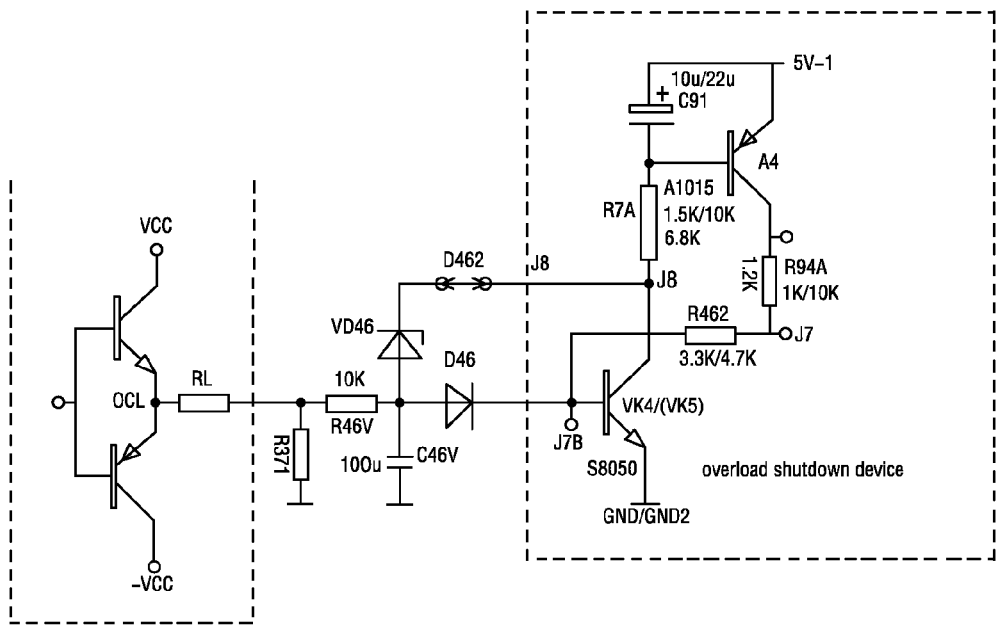
FIG. 2 is the necessary circuit-related embodiment concerning technologies in this invention and relevant over-load shutdown devices.
Figure 3:
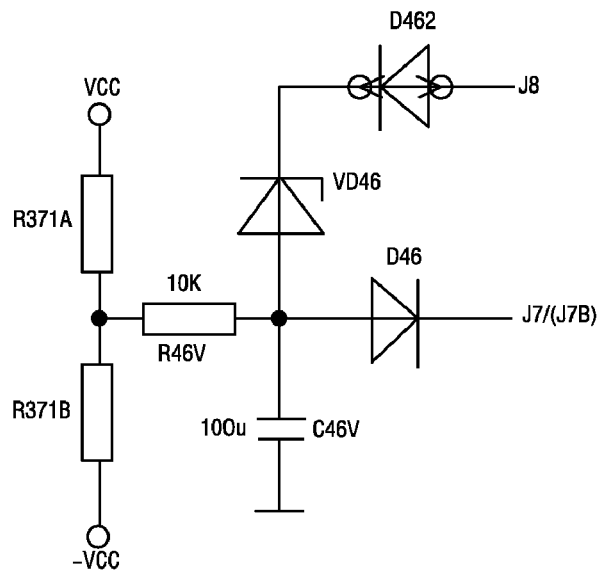
FIG. 3 is the embodiment about detection source after the over-current detection resistance R371 is changed for sampling using two equivalent divider resistor from positive and negative dual power.

Different from the configuration shown in FIG. 2, the current series negative feedback resistor R371 in the OCL last stage output load RL circuit can also be configured such that the resistor R371 serving as the detection source samples from two equivalent divider resistor in the positive and negative dual power supply. When the level of voltage at positive and negative power source VCC and –VCC circuit ports is asymmetrical, it can serve as protection against severe over current. However, the protective effect is not so good as that in the solution of examples set out in FIG. 1 or FIG. 2 because the voltage output from positive and negative current is usually symmetrical in volume, and moreover, they are in opposite directions and power source internal resistance is very small. Unless there is one severe short circuit in the respective load of the positive and negative power, the internal resistance of power sources of over current will cause a voltage drop, which can lead to the detection of differences in the volume of circuit end voltage. Therefore, the protective effect of the examples in FIG. 3 is not so good, but it can be used in combination with the solutions of examples set out in FIG. 1 or FIG. 2. Diode D462 shown in FIG. 1 can be short circuited.

Figure 4:
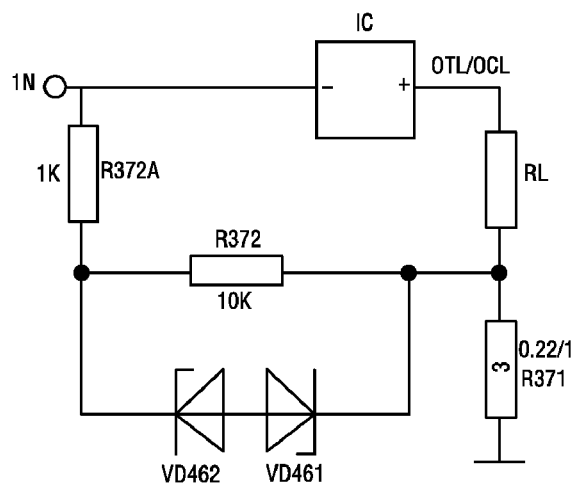
FIG. 4 is the negative feedback gains control over automatic current when the output signal is too heavy.

[Example in FIG. 4]: In the last stage output port load RL circuit of the amplifier, by series current negative feedback resistor R371, and through feedback resistor R372 and R372A branch circuit, the RL is connected with (in a reverse phase) the input port IN. At both ends of feedback resistor 8372, normally closed, overload conducting pressure-sensitive switching unit VD462 or VD461 branch circuit is connected in parallel with the feedback resistor R372. When the load current at the output end is too heavy, then when the current sampling resistor R371 voltage drop increases to a certain value, the voltage sensitive switching unit VD461/ VD462 will be automatically broken down and conducted, which enlarge negative feedback to automatically reduce the gains control.

Figure 5:
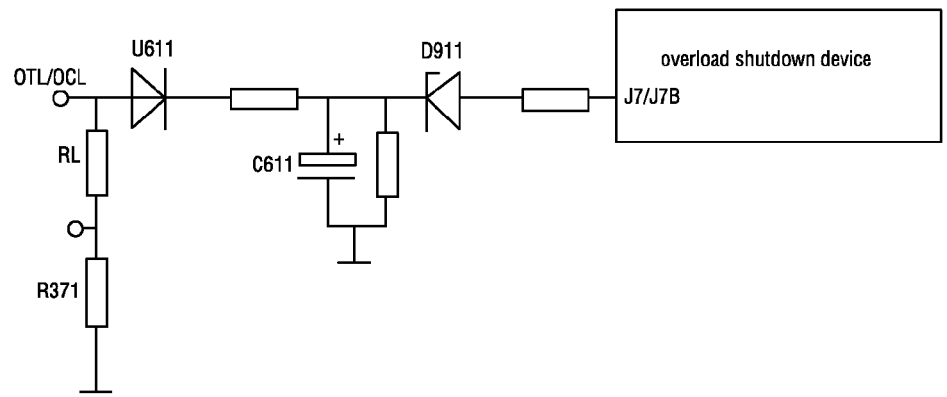
FIG. 5 and FIG. 6 are the automatic shutdown circuit when output signal is too heavy.
Figure 6:
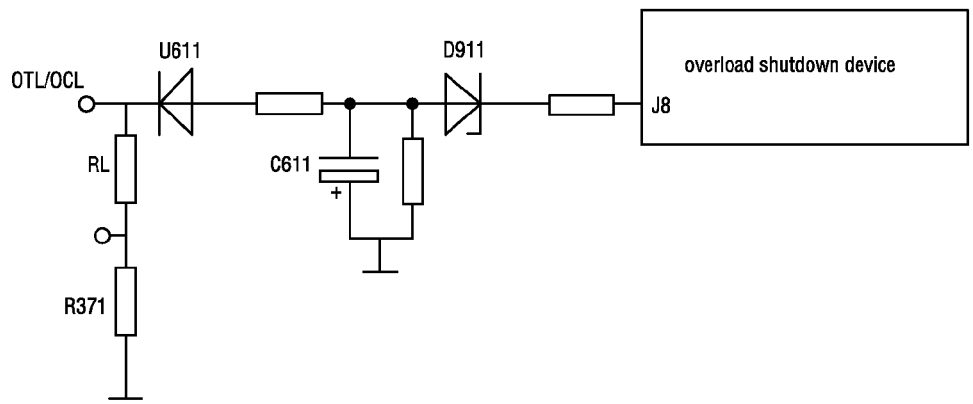

[Example in FIG. 5 or FIG. 6]: Both ends of the driven output port load RL of the amplifier, after the filtering of Capacitor C611 of diode U611 rectifier used as the detection source, and through the normally closed, and overload conducting pressure sensitive switching unit D911, is connected to J7/(J7B) or J8 in the overload shutdown device so as to achieve automatic shutdown when output signal amplitude is too large.

Figure 7:
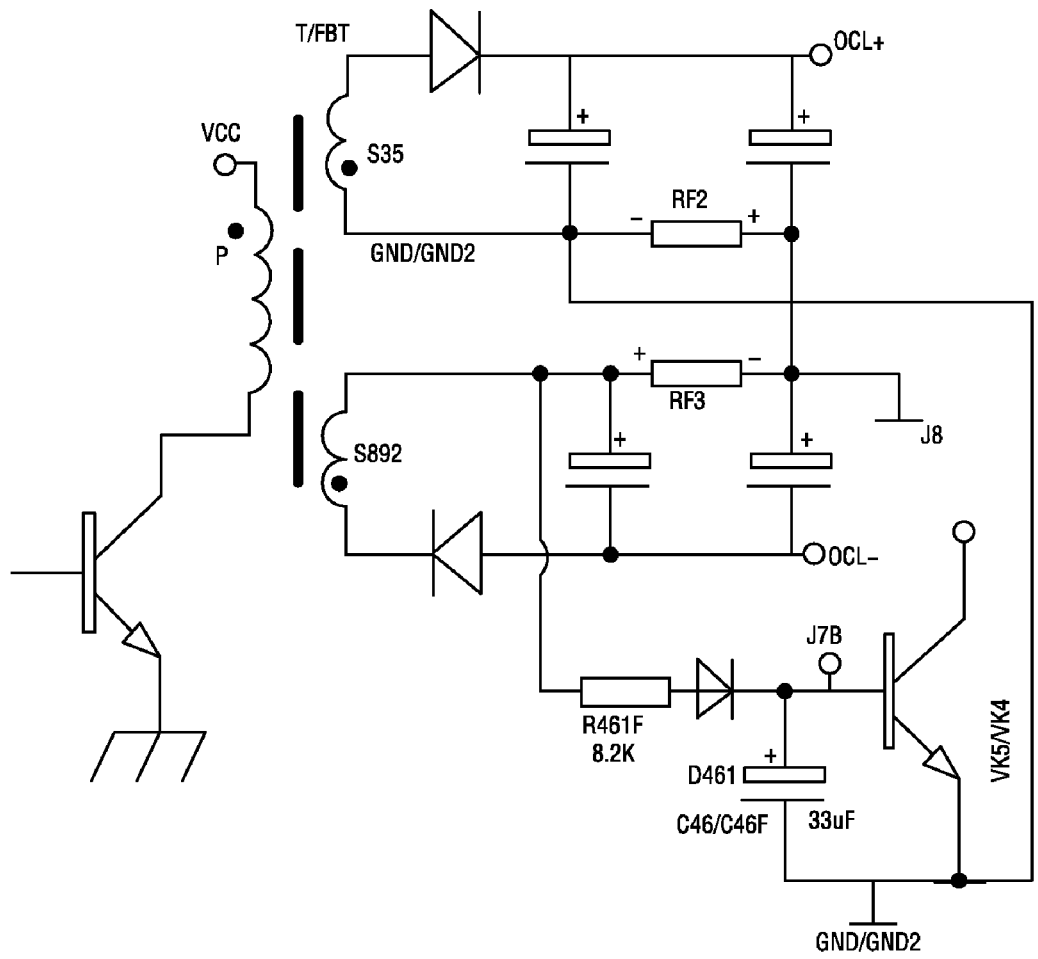
FIG. 7 or FIGS. 8A-C show the protection circuit against total average current overload at input terminal, and also the embodiment of over current protection circuits while simultaneous damages are happen to respective loads of positive and negative dual power.

[Example in FIG. 7]: Adjacent to the grounding end of the rectifier filtering circuits of the positive and negative dual power supply, power sampling resistors RF2 and RF3 are connected in series respectively. After in-phase stack of voltage drop at both ends of the sampling resistors RF2 and RF3, the sampling resistor RF3 is connected to the control triode VK4 or VK5 base branch circuit in the normally closed and overload conducting overload shutdown devices by diode D461 and resistor R461F branch circuit, which realize the protection against over current of OCL circuit total input ports supplied by positive and negative dual power supply or other abnormal automatic shutdown. Either Diode D461 or Resistor R461F can be selectively short circuited.

Figure 8A:
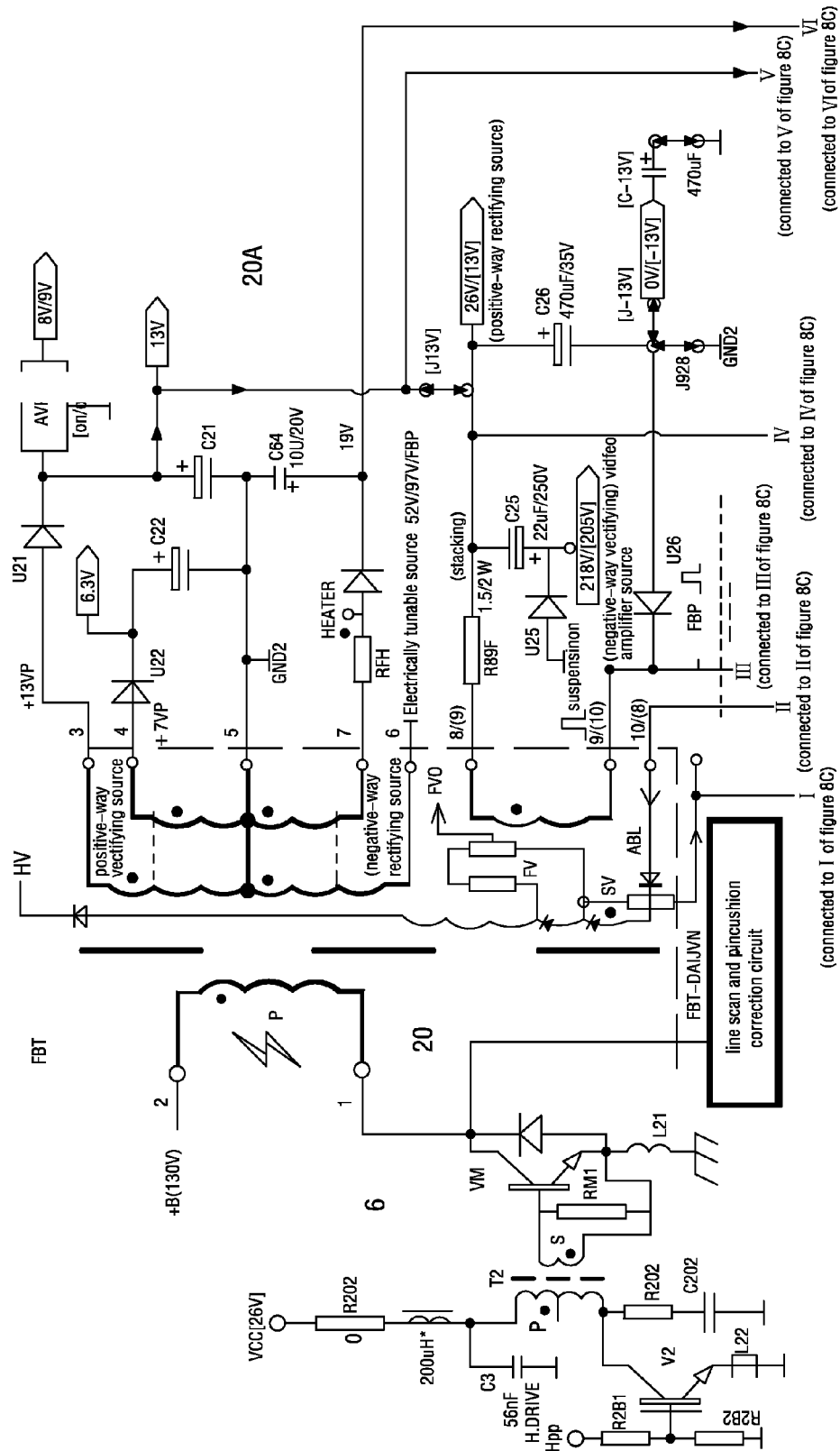
Figure 8B:
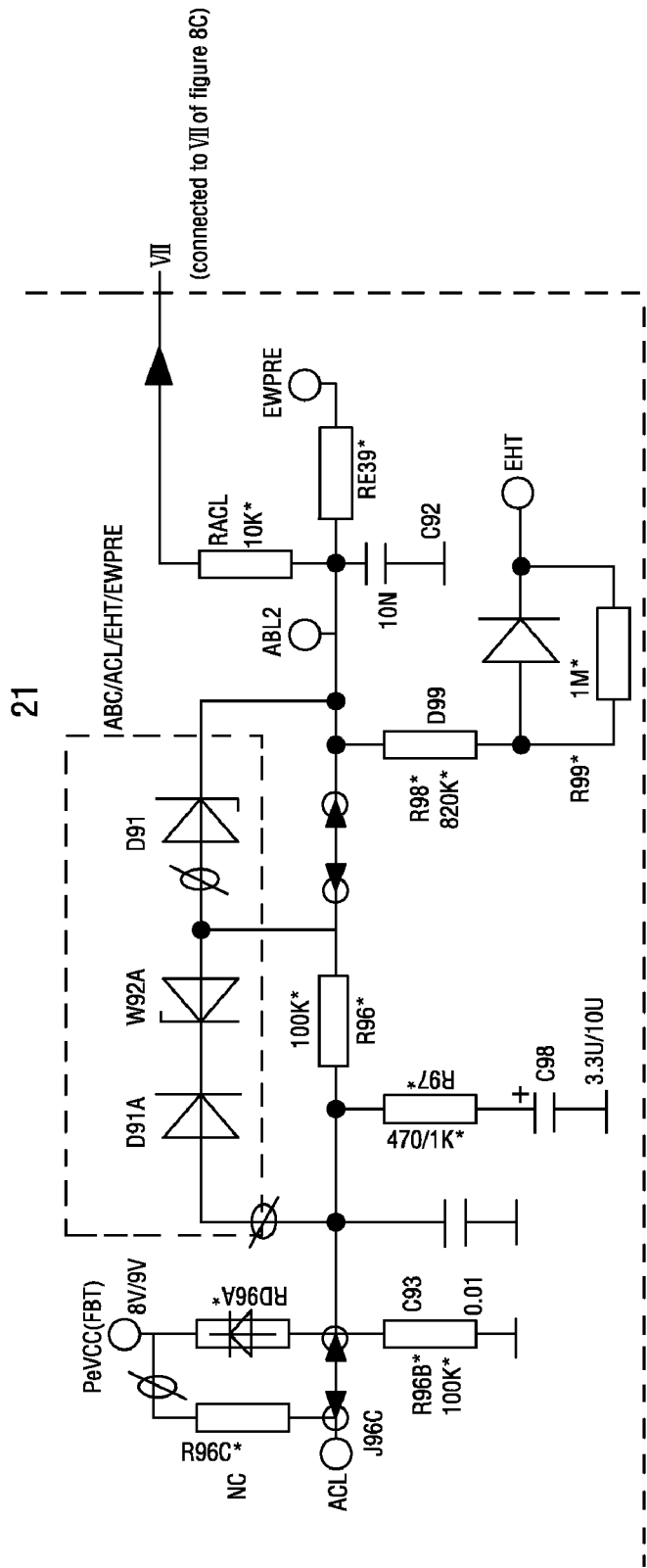
Figure 8C:
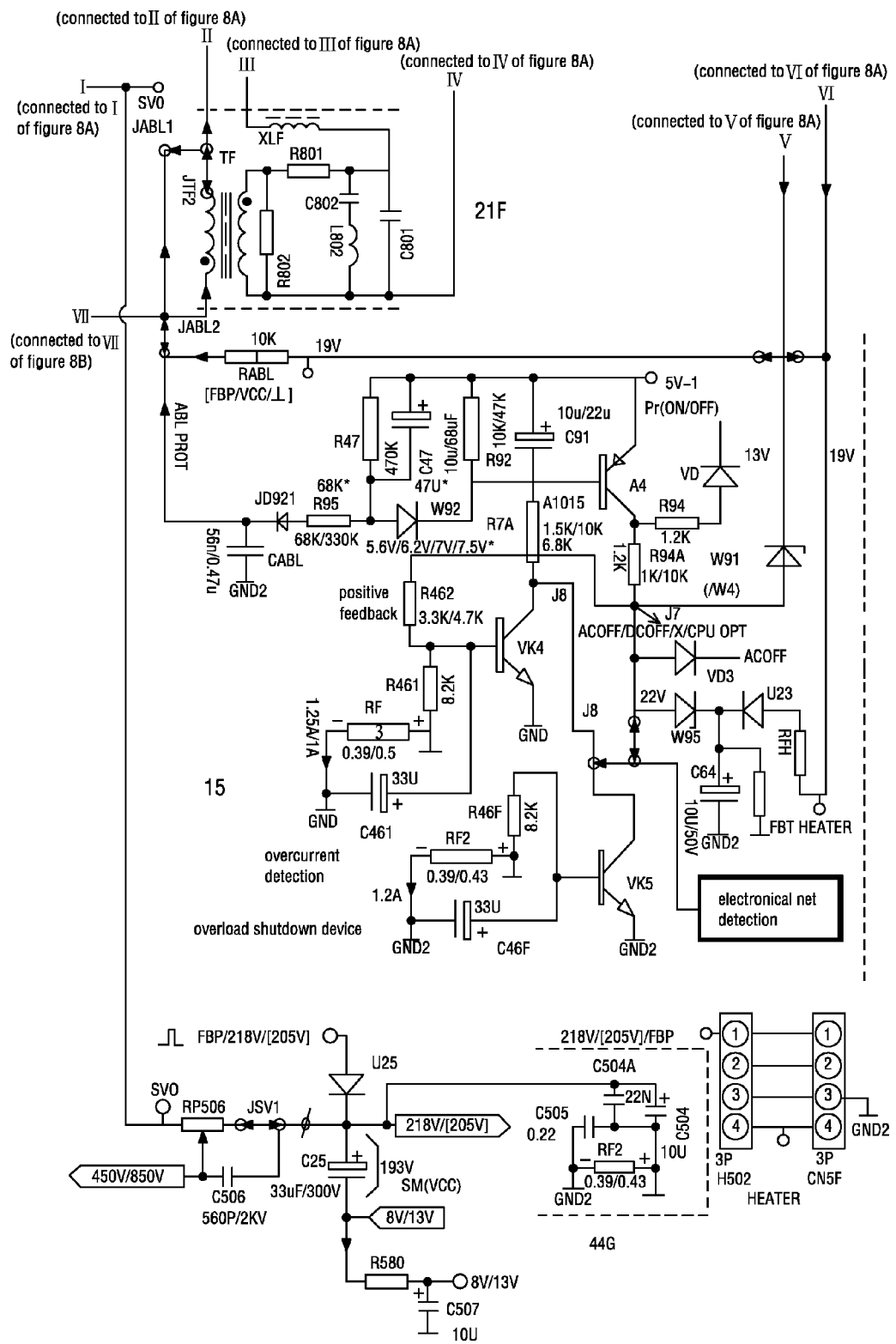

[Example in FIGS. 8A-C]: As an optimal embodiment in color TV application, the circuit includes a line scan circuit (6), a fly-back transformer FBT (20), a fly-back transformer FBT secondary winding power supply distribution circuit (20A) (See FIG. 8A), an overload shutdown device (15), an automatic brightness, automatic contrast and automatic line width circuit (21), and a CRT plate ground wire anti-high voltage/antistatic device (44G). A dynamic focusing circuit (21F) can be added (or removed). The overload shutdown device (15) can be directly applied to all electric fields.

Figure 9:
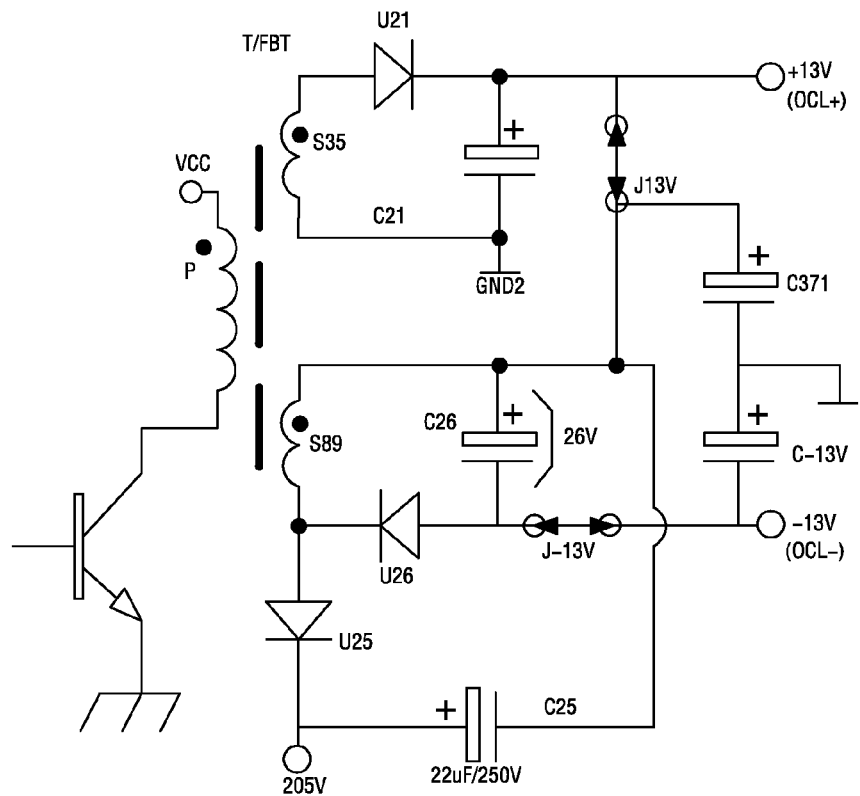
FIG. 9 and FIG. 10 are diagrams of solutions to generate positive and negative dual power through transformer T (especially color TV switching transformer T) or secondary of fly-back transformer FBT from a group of windings and solutions to switch into positive single power supply at 26V which is suitable for OTL power supply circuit, and they are both diagrams abstracted from FIGS. 8A-C.

FIG. 9 is a circuit diagram of the power distribution of positive and negative dual power supply extracted from FIGS. 8A-C. As shown, the fly-back transformer FBT or other transformer T secondary windings, after filtering of positive-way rectifying capacitor C26 of diode U26, output two times voltage (26V). The positive end of the capacitor C26 outputs one time voltage (13V) after it is connected to the fly-back transformer FBT secondary by a light ray (J13V) and after filtering of the positive-way rectifying capacitor C21 of a diode U21, with the negative end of the capacitor C26 connected to the capacitor (C-13V) by the light rays (J-13V), and the positive end of this capacitor (C-13V) and the negative end of capacitor (C371) are grounded after adjacent connection. In this way, voltage of both ends of capacitor C26 performs serial connection with capacitor C21, C371 and capacitor (C-13V) before charged. The voltage at both ends of capacitor C21 is of a large load thus providing claiming function. Through the positive ends of capacitor C21 and C371 and the negative end of capacitor (C-13V), the capacitor C26 serves as positive and negative dual power to supply power for OCL field output level.

The protection solution to this positive and negative dual power overload is described as follows. When the load of the capacitors C21 and C371 power supply (i.e. OCL upper tubes) is over current, a voltage drop may be generated by over current detection resistor RF2, which, after integration of a resistor R46F and a capacitor C46F, triggers the normally closed and overload conducting compound triodes A4 and VK5 and under chained positive feedback effect, it is immediately saturated and conducting to achieve the over current shutdown effect.

When the load of the power supply of the capacitor (C-13V) (i.e. OCL lower tube) is over current, the voltage at both ends of capacitors C21 and C371 will rise, after voltage sensitive switching unit W91 or W4 to trigger normally closed and overload conducting compound triode A4 and VK4 (or VK5), and under the chained positive feedback effect, it will achieve over voltage shutdown effect after immediate conducting. Obviously, the solution to the over current protection for realizing negative voltage source load in this embodiment provides an indirect protection in which voltage at 13V rises after other line positive-way rectifying capacitor C21 is filtered by forced adjacent connection to achieve the goal of the transformation of its own over current into rise in other over voltage shutdown. This embodiment is the best overload protection solution to OCL field output circuits because this solution can not only prevent the over current protective circuits of respective loads of positive and negative dual power simultaneously damaged, but also it is the average current overload protection circuit at total input port of respective load of positive and negative dual power. It can be generally applied to all circuits such as OCL, OTL, and BTL. Moreover, there is almost no additional cost, with high timely protection reliability and accuracy. Details of a specific exemplary product are illustrated in FIGS. 8A-C.

Figure 10:
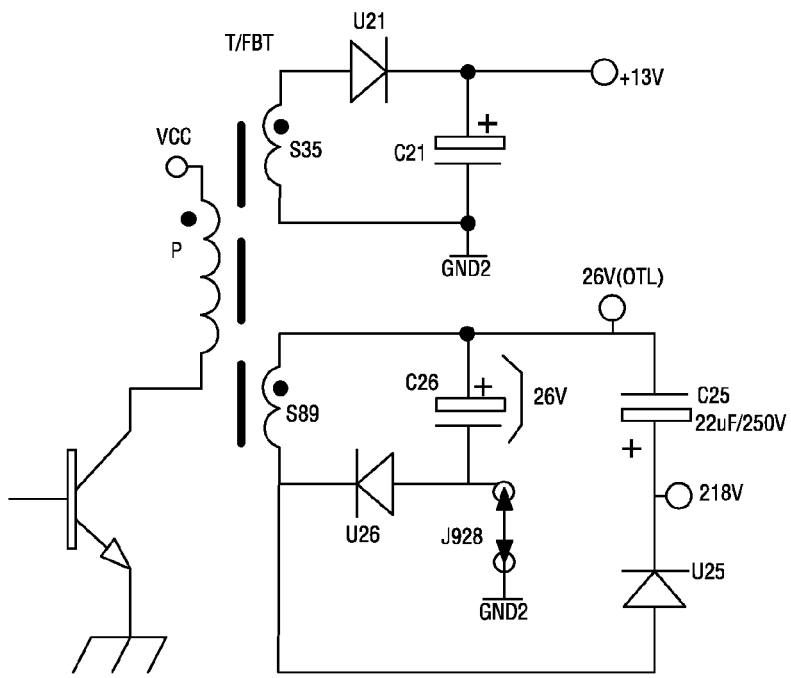

A set of independent coils of T/FBT secondary of this transformer can deliver more than 5 kinds of voltage by switchover through different connection relations of light rays J13V, J-13V, and J928. As illustrated in FIG. 9, the circuit is capable of outputting three groups of voltage like (counterway rectifier) 205V, (positive rectifier) and positive and negative 13V; fly-back transformer FBT negative-way rectifier voltage is 7.5 times or so the positive-way rectifier voltage. If light rays J13V and J-13V are removed and the negative port of capacitor C26 is directly connect to the GND2 of the transformer T/FBT by light rays J928, the transformer is capable of outputting two groups of voltage like 218V and +26V. FIG. 10 is a circuit diagram of a power distribution of positive single power source at 26V adaptable to OTL power supply abstracted from FIGS. 8A-C.

This invention applies to all positive and negative dual power or push-pull circuits in the switching state of positive single power supply such as Type D switching scanning circuit STV9388, numeric power amplifying TDA7490, MP7710/7720, etc. The solution illustrated in FIG. 1 or FIG. 2 cannot provide an effective protection against failure to detect simultaneous symmetrical abnormalities in respective loads of positive and negative dual power. If it is desired to prevent simultaneous damage to respective loads of positive and negative dual power, the examples set out in FIG. 7 or FIGS. 8A-C are preferably used. The parameters in the Figures of this disclosure are for citing reference only and thus can be adjusted according to actual requirements. There are many alternative solutions in the figures, with unnecessary components capable of being removed or short connected. This Invention can be extended to the application to electronic and electric technical fields other than TV.

All position numbers and parameters set out in the Figures of this disclosure can be changed. For example, CPU power supply terminal position number 5V–1, based on the actual demand of CPU, can be 5V, 3.3V, 1.8V and the like, and power supply terminal position number 13V can be 12V or so. Unless otherwise specified, some position numbers components, such as, resistors can be changed into diodes or other suitable components.

The solution provided by this invention can be independently used or used in combination. It is especially suitable for audio and/or video products.

INDUSTRIAL PRACTICALITY

In the embodiments of this invention, in the last stage output terminal load (RL) circuit of this dual power supply, there is additional or applicable series current negative feedback resistor R371 as the detection source, which, after integration of resistor R46V and capacitor C46V, and then through the pressure sensitive switching unit VD46 or diodes D46 branch circuit, is connected to normally closed and overload conducting overload shutdown devices so as to perform timely and effective protection against over current of the OCL circuits supplied by positive and negative dual power or other abnormalities.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A protective device against abnormality for positive and negative dual power supply circuit, comprising:
   a dual power OCL power circuit including a positive power supply and a negative power supply;
   a series current negative feedback resistor located in a last stage output terminal load of the dual power OCL power circuit as a detection source;
   an integration circuit connected to the series current negative feedback resistor, the integration circuit including a resistor and a capacitor;
   a voltage dependent switching unit branch circuit connected to the integration circuit;
   a diode branch circuit connected to the integration circuit; and
   an overload shutdown device, the overload shutdown device being normally shut down and being conducting when the integration circuit determines that an overcurrent caused by abnormality of either the positive power supply or the negative power supply occurs,
   wherein the dual power OCL power circuit further includes:
   a transformer, a first diode, a first, positive-way rectifying capacitor connected to the first diode, and first light rays, wherein the first diode and the first capacitor filter a voltage generated by the transformer and output a first voltage between a positive terminal and a negative terminal of the first capacitor;
   a second diode, a second, positive-way rectifying capacitor connected to the second diode, and the first light rays, wherein the second diode and the second capacitor filter a voltage generated by the transformer, a positive terminal of the second capacitor being connected to the positive terminal of the first capacitor through the first light rays and constituting the positive power supply of the dual power OCL power circuit, a value of a voltage outputted by the positive power supply being one half of the first voltage;
   a third capacitor having a negative terminal being connected to the negative terminal of the first capacitor through a second light rays and constituting the negative power supply of the dual power OCL power circuit, a value of a voltage outputted by the negative power supply being one half of the first voltage; and
   a fourth capacitor having a negative terminal adjacent to and connected to a positive terminal of the third capacitor and being connected to ground,
   wherein when a load of the second capacitor and the third capacitor is overcurrent, a voltage drop is generated by the series current negative feedback resistor, thereby the integration circuit determines that an abnormality of the positive power supply occurs and renders the overload shutdown device conducting, and
   when a load of the fourth capacitor is overcurrent, a voltage rise is generated between the positive terminal and the negative terminal of each of the second and third capacitors, thereby the integration circuit determines that an abnormality of the negative power supply occurs and renders the overload shutdown device conducting through the voltage dependent switching unit.

2. The protective device against abnormality for positive and negative dual power supply circuit according to claim 1, wherein when the load of the positive power supply and the load of the negative power supply is unbalanced and an voltage of the capacitor of the integration circuit is not zero, the overload shutdown device is conducting.

3. The protective device against abnormality for positive and negative dual power supply circuit according to claim 1, wherein one end of the series current negative feedback resistor is connected directly to the last stage output terminal load; another end of the series current negative feedback resistor being grounded.

4. The protective device against abnormality for positive and negative dual power supply circuit according to claim 1, wherein the capacitor of the integration circuit is grounded; the resistor of the integration circuit being connected to both the last stage output terminal load and the series current negative feedback resistor directly.

5. A protective device against abnormality for positive and negative dual power supply circuit, comprising:
   a dual power OCL power circuit including:
      a positive power supply;
      a negative power supply;
      a transformer, a first diode, a first, positive-way rectifying capacitor connected to the first diode, and first light rays, wherein the first diode and the first capacitor filter a voltage generated by the transformer and output a first voltage between a positive terminal and a negative terminal of the first capacitor;
      a second diode, a second, positive-way rectifying capacitor connected to the second diode, and the first light rays, wherein the second diode and the second capacitor filter a voltage generated by the transformer, a positive terminal of the second capacitor being connected to the positive terminal of the first capacitor through the first light rays and constituting the positive power supply of the dual power OCL power circuit, a value of a voltage outputted by the positive power supply being one half of the first voltage;
      a third capacitor having a negative terminal being connected to the negative terminal of the first capacitor through a second light rays and constituting the negative power supply of the dual power OCL power circuit, a value of a voltage outputted by the negative power supply being one half of the first voltage; and
      a fourth capacitor having a negative terminal adjacent to and connected to a positive terminal of the third capacitor and being connected to ground,
   a series current negative feedback resistor located in a last stage output terminal load of the dual power OCL power circuit as a detection source;
   an integration circuit connected to the series current negative feedback resistor, the integration circuit including a resistor and a capacitor;
   a voltage dependent switching unit connected to the integration circuit; and
   an overload shutdown device being normally shut down and conducting when overloaded,
   wherein when a load of the second capacitor and the third capacitor is overcurrent, a voltage drop is generated by the series current negative feedback resistor, thereby the integration circuit determines that an abnormality of the positive power supply occurs and renders the overload shutdown device conducting, and
   when a load of the fourth capacitor is overcurrent, a voltage rise is generated between the positive terminal and the negative terminal of each of the second and third capacitors, thereby the integration circuit determines that an abnormality of the negative power supply occurs and renders the overload shutdown device conducting through the voltage dependent switching unit.

6. The protective device against abnormality for positive and negative dual power supply circuit according to claim 5, wherein one end of the series current negative feedback resistor is connected directly to the last stage output terminal load; another end of the series current negative feedback resistor being grounded.

7. The protective device against abnormality for positive and negative dual power supply circuit according to claim 5, wherein the capacitor of the integration circuit is grounded; the resistor of the integration circuit being connected directly to both the last stage output terminal load and the series current negative feedback resistor.

\* \* \* \* \*